(12) United States Patent
Ounaies et al.

(10) Patent No.: US 7,402,264 B2
(45) Date of Patent: *Jul. 22, 2008

(54) SENSING/ACTUATING MATERIALS MADE FROM CARBON NANOTUBE POLYMER COMPOSITES AND METHODS FOR MAKING SAME

(75) Inventors: Zoubeida Ounaies, College Station, TX (US); Cheol Park, Yorktown, VA (US); Joycelyn S. Harrison, Hampton, VA (US); Nancy M. Holloway, White Marsh, VA (US); Gregory K. Draughon, Hampton, VA (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 361 days.

This patent is subject to a terminal disclaimer.

(21) Appl. No.: 11/076,460

(22) Filed: Mar. 3, 2005

(65) Prior Publication Data

US 2006/0084752 A1    Apr. 20, 2006

Related U.S. Application Data

(60) Provisional application No. 60/551,055, filed on Mar. 9, 2004.

(51) Int. Cl.
*H01B 1/00* (2006.01)
*H01B 1/12* (2006.01)

(52) U.S. Cl. .............. 252/511; 428/323; 528/496; 252/62.9 R; 252/500; 310/319

(58) Field of Classification Search .......... 252/500, 252/62.9 R; 524/496; 264/172.15; 310/319; 428/323
See application file for complete search history.

(56) References Cited

U.S. PATENT DOCUMENTS

| | | | |
|---|---|---|---|
| 4,675,123 A * | 6/1987 | Tsunooka et al. | ....... 252/62.9 R |
| 6,265,466 B1 | 7/2001 | Glatkowski et al. | |
| 6,276,214 B1 | 8/2001 | Kimura et al. | |
| 6,426,134 B1 | 7/2002 | Lavin et al. | |
| 6,515,077 B1 | 2/2003 | Su et al. | |
| 6,689,288 B2 | 2/2004 | St. Clair et al. | |
| 6,762,237 B2 * | 7/2004 | Glatkowski et al. | ......... 524/496 |
| 6,764,628 B2 * | 7/2004 | Lobovsky et al. | ...... 264/172.15 |
| 6,809,462 B2 * | 10/2004 | Pelrine et al. | ............... 310/319 |
| 6,936,653 B2 * | 8/2005 | McElrath et al. | ............ 524/496 |
| 2003/0008123 A1 | 1/2003 | Glatkowski et al. | |
| 2003/0158323 A1 | 8/2003 | Connell et al. | |

OTHER PUBLICATIONS

S. Courty, J., Mine, A.R. Tajbakhsh, and E.M. Terentjev "Nematic Elastomers with Aligned Carbon Nanotubes: New Electromechanical Actuators" Europhysics Letters, Dec. 1, 2003 64 (5) pp. 654-660.

* cited by examiner

*Primary Examiner*—Mark Kopec
*Assistant Examiner*—Khanh Tuan Nguyen
(74) *Attorney, Agent, or Firm*—Linda B. Blackburn; Barry V. Gibbens

(57) ABSTRACT

An electroactive sensing or actuating material comprises a composite made from a polymer with polarizable moieties and an effective amount of carbon nanotubes incorporated in the polymer for a predetermined electomechanical operation of the composite when such composite is affected by an external stimulus. In another embodiment, the composite comprises a third component of micro-sized to nano-sized particles of an electroactive ceramic that is also incorporated in the polymer matrix. The method for making the three-phase composite comprises either incorporating the carbon nanotubes in the polymer matrix before incorporation of the particles of ceramic or mixing the carbon nanotubes and particles of ceramic together in a solution before incorporation in the polymer matrix.

10 Claims, 2 Drawing Sheets

SENSING/ACTUATING MATERIALS MADE FROM CARBON NANOTUBE POLYMER COMPOSITES AND METHODS FOR MAKING SAME

Pursuant to 35 U.S.C. §119, the benefit of priority from provisional application 60/551,055, with a filing date of Mar. 9, 2004, is claimed for this non-provisional application.

ORIGIN OF THE INVENTION

The invention was made in part by employees of the United States Government and may be manufactured and used by and for the Government of the United States for governmental purposes without the payment of any royalties thereon or therefore.

FIELD OF THE INVENTION

This invention relates to electroactive materials. More specifically, the invention relates to electroactive sensing or actuating materials in which polymers have carbon nanotubes as inclusions or carbon nanotubes and ceramic particles as inclusions.

SUMMARY OF THE INVENTION

An electroactive sensing or actuating material comprises a composite made from (i) a polymer with polarizable moieties, and (ii) an effective amount of carbon nanotubes in the polymer that provides for electromechanical operation of the composite when the composite is affected by an external stimulus.

DETAILED DESCRIPTION OF THE EMBODIMENTS

Figure 1:
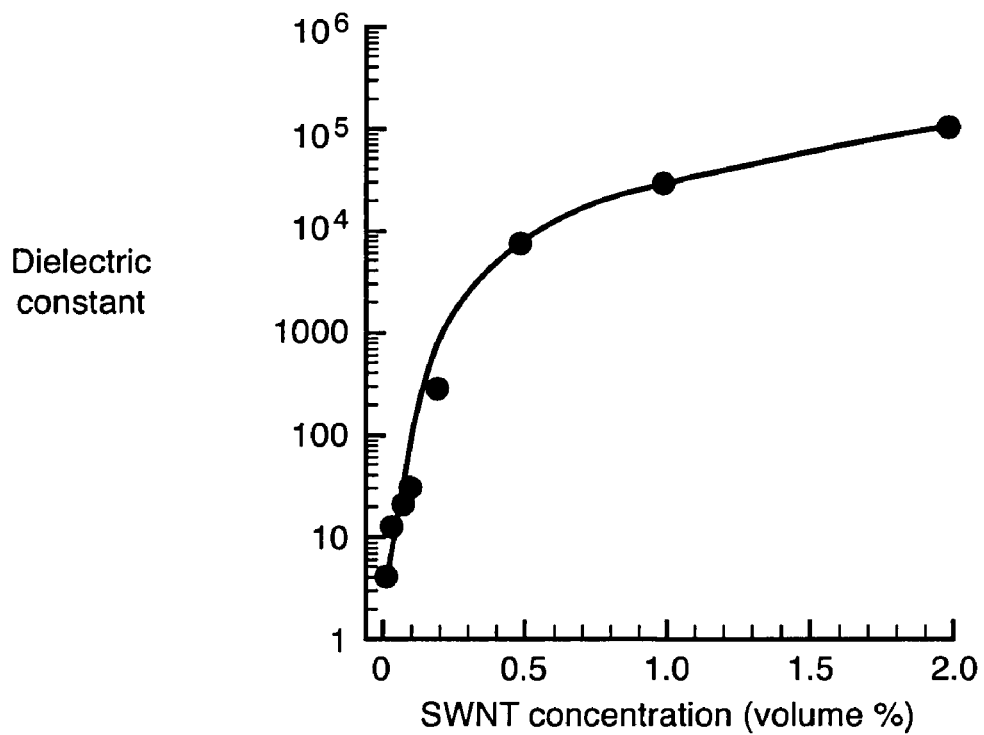
FIG. 1 is a graph of dielectric constant as a function of carbon nanotube content for an embodiment of a 2-phase carbon nanotube/polyimide composite of the present invention.

The present invention comprises an electroactive material that provides a predetermined electromechanical operation when affected by some external stimulus. For example, the electromechanical operation can be a sensing operation that involves the generation of an electrical signal in response to deformation of the electroactive material caused by a change in its physical environment (e.g., changes in noise, vibration, stress, pressure, flow, temperature, etc.). The electromechanical operation can also be an actuating operation that involves mechanical movement of the electroactive material when the material has a stimulating electric potential applied thereto.

One embodiment of an electroactive sensing/actuating ("sensuating") material of the present invention comprises a 2-component or "2-phase" composite material. The base material is a polymer matrix wherein the polymer comprises an electroactive type having polarizable moieties. The remaining component or phase comprises nanotubes incorporated in the polymer matrix. In terms of the present invention, electroactive polymers with polarizable moieties include those with asymmetrically strong dipoles. Suitable polymer classes fitting this description include, but are not limited to, polyimides, polyamides, silicon-based polymers, vinyl polymers, polyurethanes, polyureas, polythioureas, polyacrylates, polyesters, and biopolymers. The polyimides include but are not limited to 2,6-bis(3-aminophenoxy)benzonitrile ((β-CN)APB)/4,4'oxydiphthalic anhydride (ODPA) ((β-CN)APB-ODPA) and other polyimides with polarizable moieties, and polyetherimide (e.g., the commercially-available ULTEM®). The polyamides include but are not limited to odd-numbered nylons. The silicon-based polymers include but are not limited to silicone and polydimethylsiloxane (PDMS). The vinyl polymers include but are not limited to PVDF, PVDF/TrFE (copolymer of vinylidene fluoride and trifluoroethylene), poly(vinyl alcohol) (PVA), a graft elastomer such as that claimed in U.S. Pat. No. 6,515,077, the entire contents of which are incorporated herein by reference, and vinyl copolymers. The polyacrylates include but are not limited to polymethyl methacrylate (PMMA). The biopolmers include but are not limited to polypeptides and keratin.

The presence of strong dipoles (associated with the above-mentioned polymers with polarizable moieties) have led researchers and industry to attempt to construct piezoelectric sensors and actuators from these materials and blends of such polymers as disclosed, for example, in U.S. Pat. No. 6,689,288, the entire contents of which are incorporated herein by reference.

The 2-phase electroactive materials of the present embodiment use nanotube inclusions to improve the electomechanical response of the polymer having polarizable moieties. In general, such nanotubes can be based on a variety of elements, including carbon or other metallic and semi-metallic elements. However, carbon nanotubes will be described specifically in the example. Such carbon nanotubes can be single-wall nanotubes (referred to as "SWNT"), or they can be nanotubes made from multiple walls, e.g., double-wall, few-wall, multi-wall, etc., all of which are referred to herein as "MWNT".

Accordingly, the present embodiment's 2-phase electroactive sensing/actuating (or sensuating) composite comprises a selected polymer matrix having nanotube inclusions. In order to produce an electroactive material that acts as either a sensor or actuator, it has been discovered that only small amounts of carbon nanotubes need to be incorporated into the polymer matrix. The small amounts of nanotubes used in the 2-phase composite materials are defined herein as a volume fraction of the ultimate composite. For example, the volume fraction of nanotubes in the exemplary 2-phase composite is expressed as "X percent of the volume of the composite". The value of "X" is arrived after consideration of the type of operation (e.g., sensing, actuating) and the amount of electromechanical motion of interest for a given polymer matrix and given external stimulus. No specific volume fraction of nanotubes (for a particular polymer) will define a clear transition between sensing and actuating operations. Rather, a general range of volume fraction of nanotubes will enable the composite to behave better as either a sensor or actuator. Thus, the sensing or actuating functions of the material for the present embodiment can be varied and controlled by the volume fraction of nanotube inclusions.

The above-described embodiment of a 2-phase sensing/actuating (sensuating) polymer composite comprises pure polymers with polarizable moieties having nanotube inclusions. However, the present invention has other embodiments. For example, another embodiment of the present invention provides a 3-phase polymer composite wherein the three components comprise:

(i) a polymer matrix wherein the polymer is an electroactive type having polarizable moieties, (ii) micro to nano-sized particles of an electroactive ceramic incorporated in the polymer matrix, and (iii) carbon nanotubes incorporated in the polymer matrix.

Prior efforts to improve the electromechanical operation of pure piezoelectric polymers have focused on incorporating various piezoelectric ceramics (e.g., lead-zirconium-titanate or "PZT") into the polymers to form a composite. However, the large dielectric mismatch between these two significantly different types of materials (i.e., ceramic-to-polymer dielectric ratios on the order of 50:1 or greater) makes it difficult to pole both phases of the composite. That is, the electric field required to pole both phases is generally much larger than the electric field required to pole the pure ceramic phase because of a large dielectric mismatch.

The 3-phase sensing/actuating (sensuating) composites reduce dielectric mismatch through the use of small amounts of nanotube inclusions. As in the 2-phase case, nanotubes utilized in the 3-phase composites can be based on a variety of elements to include carbon and other metallic or semi-metallic elements. Carbon nanotubes will be described specifically in the example. The carbon nanotubes used in the 3-phase composite can be SWNT or MWNT.

The electroactive ceramics utilized in the 3-phase composite of the present embodiment can be any piezoelectric ceramic that can be reduced to micro-sized or nano-sized particles while providing the appropriate electromechanical response, thermal stability and chemical stability for a predetermined application. Such ceramics include but are not limited to lead-zirconium-titanate (PZT), lanthanum-modified lead zirconate titanate (PLZT), niobium-modified lead zirconate titanate (PNZT), and barium titanate. By way of illustrative example, the electroactive ceramic PZT will be specifically discussed.

The present embodiment of the 3-phase composite comprises a selected polymer matrix with both ceramic and nanotube inclusions. To produce a 3-phase composite that acts as either a sensor or actuator, only small amounts of nanotubes need to be incorporated in the composite. Similar to the 2-phase composite, the amount of nanotube inclusions is expressed as a volume fraction of nanotubes to the total volume of the ultimate 3-phase composite.

Methods for making the 3-phase composite include steps for the nanotubes to be either: (i) incorporated in the polymer matrix before incorporation of the ceramic particles, or (ii) first mixed with the ceramic particles in a solution that is then incorporated in the polymer matrix.

The three-component nature of the 3-phase composite provides for the tailoring and adjusting of composition and morphology to optimize mechanical, electrical, and electromechanical properties for sensing and actuating operations. The effects of the dielectric mismatch between the polymer and ceramic are greatly reduced by nanotube inclusions that serve to raise the dielectric constant of the polymer matrix in the 3-phase composite even when small amounts of nanotubes are used. Thus, the amount of nanotubes used is a predetermined volume fraction that balances the amount required to minimize the dielectric mismatch between the polymer and ceramic against the amount requisite for providing a predetermined electromechanical operation during a given application.

EXAMPLES

By way of illustration, examples of 2-phase and 3-phase composite materials in accordance with the teachings of the embodiments will now be described. The selected polymer in both the 2-phase and 3-phase materials was an aromatic piezoelectric polyimide, β-CN APB/ODPA polymer matrix. The nanotubes used were single-wall carbon nanotubes or "SWNT" as they will be referred to hereinafter. The diameter and length of the SWNTs were approximately 1.4 nm and 3 μm, respectively. The 2-phase SWNT-polyimide composites were prepared by in situ polymerization under sonication and stirring. The density of pure polyimide was about 1.3 g/cm$^3$, and the calculated density of the SWNTs have been reported ranging from 1.33-1.40 depending on chirality. The diamine and dianhydride used to synthesize the nitrile polyimide were 2,6-bis(3-aminophenoxy) benzonitrile ((β-CN)APB) and 4,4'oxidiphthalic anhydride (ODPA), respectively. To prepare the SWNT-polyimide 2-phase composite, the SWNTs were dispersed in anhydrous dimethyl formamide (DMF) that served as a solvent for the poly(amic acid) synthesis. The entire reaction was carried out with stirring in a nitrogen-purged flask immersed in a 40 kHz ultrasonic bath until the solution viscosity increased and stabilized. Sonication was terminated after three hours and stirring was continued for several hours to form a SWNT-poly(amic acid) solution. The SWNT-poly(amic acid) solution was cast onto a glass plate and dried in a dry air-flowing chamber. Subsequently, the dried tack-free film was thermally cured in a nitrogen oven to obtain solvent-free freestanding SWNT-polyimide film.

A series of SWNT-polyimide nanocomposite films were prepared with SWNT concentrations ranging from just greater than 0.00 percent (e.g., 0.01 percent) to approximately 2.0 percent volume fractions. A similar procedure was followed to make the 3-phase SWNT-PZT-polyimide composites (having similar SWNT concentrations) where, in addition to dispersing the SWNT in DMF before the poly(amic acid) synthesis, nano-sized PZT particles/powders were also dispersed in DMF separately and then mixed with SWNT-DMF and the polyimide precursor.

FIG. 1 shows the dielectric constant as a function of SWNT content for a 2-phase SWNT-polyimide composite. Sensing and actuating characteristics are strongly related to the dielectric properties and a higher dielectric constant material tends to provide greater electromechanical responses. The dielectric constant of the pristine polyimide was about 4.0. A sharp increase of the dielectric constant value was observed when a volume fraction of SWNTs between 0.02 and 0.1 percent was added to thereby change the dielectric constant from 4.1 to 31. This behavior is indicative of a percolation transition. Percolation theory predicts that there is a critical concentration or percolation threshold at which a conductive path is formed in the composite causing the material to convert from a capacitor to a conductor. FIG. 1 indicates that the percolation threshold for this material resides between 0.02 and 0.1 percent volume fraction of SWNTs. The dielectric constant increases rapidly up to a 0.5 percent SWNT volume fraction and thereafter increases moderately with increasing SWNT volume fraction.

Figure 2:
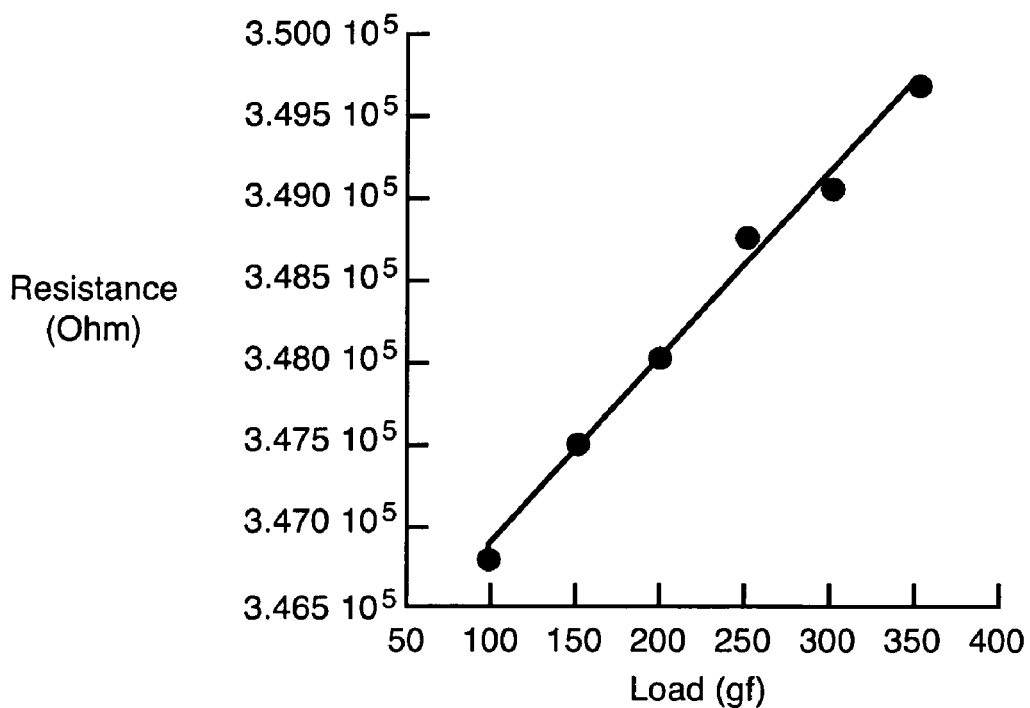
FIG. 2 is a graph of resistance as a function of load for an embodiment of a 2-phase carbon nanotube/polyimide composite of the present invention.

In FIG. 2, the resistance of a 0.2 percent SWNT-polyimide composite film is shown as a function of load in grams force (gf). Resistance was monitored using a 4-probe technique while the film was elongated in tensile mode under a constant rate of load. The resistance increased nearly linearly with the applied load at a rate of 114 ohm/g. This linear response indicates that this SWNT-polyimide composite can be used as a sensitive strain, load or pressure sensor. The sensitivity can be tailored by controlling the SWNT concentration for a specific application.

Figure 3:
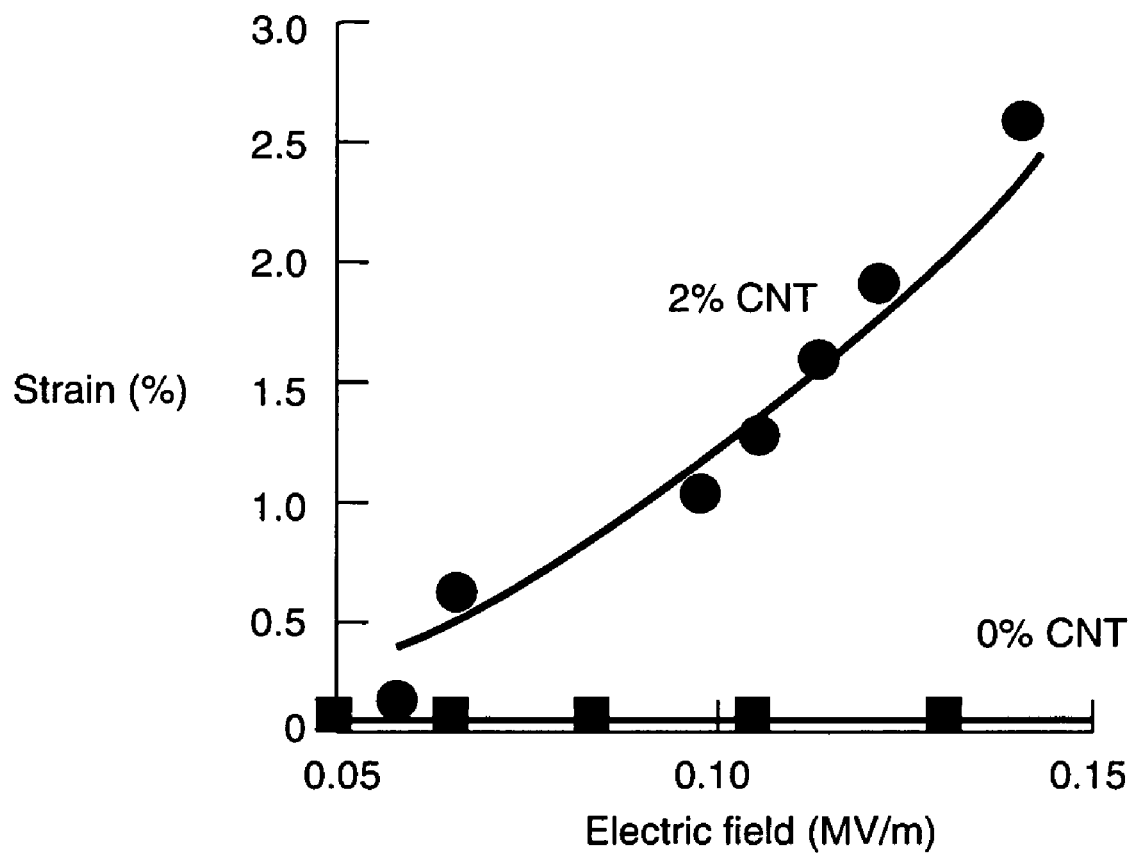
FIG. 3 is a graph of strain as a function of applied electric field for an embodiment of a 2-phase carbon nanotube/polyimide composite of the present invention.

FIG. 3 shows the strain of a 2.0 percent SWNT-polyimide composite as a function of the applied electric field. The strain increased with the square of the applied electric field thereby indicating that the strain was primarily due to electrostriction with negligible Maxwell effect rather than a piezoelectric response. The strain reached nearly 3% at 0.15 MV/m. This result is almost an order of magnitude greater strain simultaneous with an order of magnitude lower applied field when compared to commercial products such as PVDF and PZT, as noted in Table 1. A strip of this material demonstrated significant displacement when an electric field was applied. Further, the material then returned to the initial position when the field was removed. This type of electroactive response indicates that this composite can be used as an actuator.

TABLE 1

| | Strain for Electric Field | |
|---|---|---|
| Material | Strain | Electric Field |
| PVDF | 0.1% | ~50 MV/m |
| PZT | 0.1% | ~1 MV/m |
| 2% SWNT-polyimide | 3% | ~0.2 MV/m |

The 3-phase composite will generally need the step of poling due to the piezoceramic incorporated therein. Accordingly, Table 2 presents the results of poling (i) pure polyimide, (ii) polyimide with just PZT ceramic inclusions, and (iii) a 3-phase composite material of polyimide having 0.1 percent SWNT and PZT ceramic inclusions. The remanent polarization values, which are indicative of the piezoelectric response, indicate that adding the PZT increases the $P_r$ slightly. The $P_r$ value increases dramatically, however, when poling a similar content of PZT-polyimide composite that further includes SWNTs. This result confirms that the presence of SWNTs raises the dielectric constant of the composite so that it is possible to pole the PZT particles and the polyimide simultaneously.

TABLE 2

| | Remanent Polarization | |
|---|---|---|
| Material | $E_p$ (MV/m) | $P_r$ (mC/m$^2$) |
| Polyimide | 50 | 7 |
| Polyimide + PZT | 50 | 11 |
| Polyimide + PZT + 0.1% SWNT | 50 | 84 |

The mechanical properties of the 2-phase and 3-phase composites were also measured to assess the effect of adding the SWNTs and PZT inclusions on the modulus of the polyimide. Test results reveal that significant reinforcement occurs at temperatures below and above the glass transition temperature due to the addition of SWNTs, although a larger reinforcement effect occurs at temperatures above the glass transition temperature.

The inclusion of nanotubes such as carbon nanotubes (e.g., SWNTs, MWNTs, etc.) in polymers with polarizable moieties (i.e., pure polymers with polarizable moieties or ones having ceramic particles incorporated therein) provides materials capable of electroactive sensing or actuating. Moreover, such sensing and actuating can be specifically tailored as a function of carbon nanotube volume fraction for a specific application. Carbon nanotube-enhanced polymer composites can provide greater sensing and actuating responses at much lower external stimuli as compared to other known electroactive materials. Such new materials will find great utility in aeronautics and aerospace systems.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function and step-plus-function clauses are intended to cover the structures or acts described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed as new and desired to be secured by Letters Patent of the United States is:

1. An electroactive sensing/actuating material comprising a composite of (i) a polymer with polarizable moieties, (ii) an effective amount of carbon nanotubes in said polymer for a predetermined electromechanical operation of said composite when said composite is affected by an external stimulus, and (iii) micro to nano-sized particles of an electroactive ceramic in said polymer wherein a ratio of dielectric constant of said ceramic to dielectric constant of said polymer is at least 50:1, and wherein said nanotubes are incorporated in said polymer in an effective amount that provides a dielectric constant for said composite that is greater than said dielectric constant of said polymer while simultaneously providing for said predetermined electromechanical operation of said composite.

2. An electroactive sensing/actuating material as in claim 1 wherein said ceramic is selected from the group consisting of lead-zirconium-titanate (PZT), lanthanum-modified lead zirconate titanate (PLZT), niobium-modified lead zirconate titanate (PNZT), and barium titanate.

3. An electroactive sensing/actuating material as in claim 1 wherein said polymer is selected from the group consisting of polyimides, polyamides, silicon-based polymers, vinyl polymers, polyurethanes, polyureas, polythioureas, polyacrylates, polyesters and biopolymers.

4. An electroactive sensing/actuating material as in claim 1 wherein said carbon nanotubes are selected from the group consisting of single-wall carbon nanotubes and multi-wall carbon nanotubes.

5. An electroactive sensing/actuating material as in claim 3 wherein said carbon nanotubes are selected from the group consisting of single-wall carbon nanotubes and multi-wall carbon nanotubes.

6. An electroactive sensing/actuating material as in claim 5 wherein said ceramic is selected from the group consisting of lead-zirconium-titanate (PZT), lanthanum-modified lead zirconate titanate (PLZT), niobium-modified lead zirconate titanate (PNZT), and barium titanate.

7. An electroactive sensing/actuating material as in claim 6 wherein said polymer comprises polyimide and said single-wall carbon nanotubes exist in said composite in a volume fraction thereof that is greater than 0.0 percent and less than or equal to approximately 2.0 percent.

8. An electroactive sensing/actuating material as in claim 6 wherein said polymer comprises polyimide and said single-wall carbon nanotubes exist in said composite in a volume fraction thereof such that said predetermined electromechanical operation is a sensing operation.

9. An electroactive sensing/actuating material as in claim 6 wherein said polymer comprises polyimide and said single-wall carbon nanotubes exist in said composite in a volume fraction thereof such that said predetermined electromechanical operation is an actuating operation.

10. An electroactive sensing/actuating material as in claim 1 wherein said composite is poled.

* * * * *